United States Patent
Cheon et al.

(10) Patent No.: US 12,550,507 B2
(45) Date of Patent: Feb. 10, 2026

(54) DISPLAY APPARATUS

(71) Applicant: Samsung Display Co., Ltd., Yongin-si (KR)

(72) Inventors: Soohong Cheon, Yongin-si (KR); Kyeuk Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 508 days.

(21) Appl. No.: 18/091,646

(22) Filed: Dec. 30, 2022

(65) Prior Publication Data

US 2023/0216013 A1     Jul. 6, 2023

(30) Foreign Application Priority Data

Dec. 31, 2021  (KR) .................. 10-2021-0194548

(51) Int. Cl.
  *H10H 20/857*  (2025.01)
  *H01L 25/075*  (2006.01)
  *H10H 20/831*  (2025.01)
  *H10H 20/851*  (2025.01)

(52) U.S. Cl.
  CPC ....... *H10H 20/857* (2025.01); *H01L 25/0753* (2013.01); *H10H 20/8312* (2025.01); *H10H 20/8514* (2025.01)

(58) Field of Classification Search
  CPC ............ H10H 20/857; H10H 20/8514; H10H 20/8312; H01L 25/0753
  See application file for complete search history.

(56) References Cited

U.S. PATENT DOCUMENTS

| | | |
|---|---|---|
| 2019/0348470 A1 | 11/2019 | Song et al. |
| 2021/0200361 A1* | 7/2021 | Park .................. H10K 59/873 |
| 2021/0202615 A1 | 7/2021 | Kim |
| 2021/0217835 A1* | 7/2021 | Park .................. H10K 50/844 |

FOREIGN PATENT DOCUMENTS

| | | |
|---|---|---|
| KR | 10-2020-0079899 | 7/2020 |
| KR | 10-2021-0082729 | 7/2021 |
| KR | 10-2021-0083709 | 7/2021 |
| KR | 10-2021-0086044 A | 7/2021 |
| KR | 10-2021-0094833 | 7/2021 |

* cited by examiner

*Primary Examiner* — Mary Ellen Bowman
(74) *Attorney, Agent, or Firm* — F. CHAU & ASSOCIATES, LLC

(57) ABSTRACT

A display apparatus includes a light-emitting diode disposed on a substrate, the light-emitting diode including a first electrode arranged in a display area, a second electrode disposed on the first electrode, and an emission layer disposed between the first electrode and the second electrode, and a main common voltage line arranged in a non-display area outside the display area, the main common voltage line electrically connected to the second electrode, the main common voltage line including an inner edge adjacent to the display area and an outer edge opposite to the inner edge, and a pattern including bars arranged in a direction from the inner edge to the outer edge.

20 Claims, 10 Drawing Sheets

DISPLAY APPARATUS

CROSS-REFERENCE TO RELATED APPLICATION(S)

This application claims priority to Korean Patent Application No. 10-2021-0194548 under 35 U.S.C. § 119, filed on Dec. 31, 2021, in the Korean Intellectual Property Office, the entire contents of which are incorporated herein by reference.

1. Technical Field

The embodiments relate to a display apparatus.

2. Description of the Related Art

A display apparatus such as an organic light-emitting display apparatus includes transistors arranged in a display area to control luminance of light-emitting diodes. The transistors control light-emitting diodes to emit light of a selected color by using a data signal, a driving voltage, and a common voltage, which are transferred to the transistors.

One of the electrodes of the light-emitting diodes may receive a selected voltage via a transistor, and the other electrode may receive a voltage through an auxiliary wire.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

As the number of processes for manufacturing a display apparatus increases, it is necessary to precisely control the location of layers included in the display apparatus. When the layer or layers are misaligned, the quality of the display apparatus may be degraded, or defects may be generated. The embodiments provide a display apparatus having a structure for tracking locations of some layers of the display apparatus. However, the above objective is an example, and the scope of the embodiments of the disclosure is not limited by the above objective.

Additional aspects will be set forth in part in the description which follows and, in part, will be apparent from the description, or may be learned by practice of the embodiments of the disclosure.

According to one or more embodiments, a display apparatus may include a light-emitting diode disposed on a substrate, the light-emitting diode including: a first electrode arranged in a display area, a second electrode on the first electrode, and an emission layer between the first electrode and the second electrode, and a main common voltage line arranged in a non-display area outside the display area, the main common voltage line electrically connected to the second electrode, the main common voltage line including an inner edge adjacent to the display area, an outer edge opposite to the inner edge, and a pattern including bars arranged in a direction from the inner edge to the outer edge.

The emission layer may overlap an entire area of the display area in a plan view. An edge of the emission layer may overlap the pattern in the non-display area in a plan view.

The main common voltage line may include an additional pattern that is spaced apart from the pattern. The second electrode may overlap the entire area of the display area in a plan view. An edge of the second electrode may overlap the additional pattern in the non-display area in a plan view.

The edge of the emission layer may be disposed between the edge of the second electrode and the display area.

The main common voltage line may include an additional pattern that is spaced apart from the pattern. The additional pattern may include bars arranged in a direction from the inner edge to the outer edge.

The main common voltage line may include a hole between neighboring ones among the bars of the pattern.

An interval between the neighboring ones among the bars of the pattern may be constant.

The main common voltage line and the first electrode may include a same material.

The main common voltage line may include exhaust holes arranged around the pattern, the exhaust holes overlapping in a plan view an organic insulating layer disposed below the main common voltage line.

The display apparatus may further include a bank layer overlapping an edge of the first electrode in a plan view, the bank layer including a light-emission opening overlapping the first electrode in a plan view. The bank layer may extend over the main common voltage line and may overlap the pattern in a plan view.

In the embodiments, a display apparatus may include light-emission areas disposed on a substrate and arranged in a display area, an encapsulation layer disposed on the light-emission areas, a color conversion-transmission layer disposed on the encapsulation layer, the color conversion-transmission layer including a color conversion portion that converts a color of light emitted from a light emitting area among the light-emission areas and a transmission portion that transmits light emitted from another light-emission area among the light-emission areas, and at least one pattern arranged in a non-display area outside the display area. The at least one pattern may include bars arranged in a first direction.

The display apparatus may further include first electrodes spaced apart from each other in the display area, the first electrodes respectively corresponding to the light-emission areas, an emission layer disposed on the first electrodes, and a second electrode disposed on the emission layer. At least one of the emission layer and the second electrode may overlap an entire area of the display area in a plan view. At least one an edge of the emission layer and an edge of the second electrode may overlap the at least one pattern in the non-display area in a plan view.

Each of the emission layer and the second electrode may overlap the entire area of the display area in a plan view. The edge of the emission layer and the edge of the second electrode may be disposed in the non-display area. The edge of the emission layer may be disposed between the edge of the second electrode and the display area.

The at least one pattern may include a first pattern and a second pattern. The first pattern and the second pattern may be spaced apart from each other. The edge of the emission layer may overlap the first pattern in a plan view. The edge of the second electrode may overlap the second pattern in a plan view.

The display apparatus may further include a bank layer overlapping an edge of each of the first electrodes and overlapping the at least one pattern in a plan view, the bank layer including light-emission openings respectively overlapping the first electrodes in a plan view.

The display apparatus may further include a main common voltage line arranged in the non-display area, the main common voltage line electrically connected to the second electrode. The at least one pattern corresponds to a portion of the main common voltage line.

The main common voltage line and the first electrodes may include a same material.

The main common voltage line may include a hole between neighboring ones among the bars of the at least one pattern.

An interval between the neighboring ones among the bars of the at least one pattern may be constant.

The main common voltage line may include exhaust holes arranged around the at least one pattern, the exhaust holes overlapping, in a plan view, an organic insulating layer disposed below the main common voltage line.

BRIEF DESCRIPTION OF THE DRAWINGS

The above and other aspects, features, and advantages of the disclosure will be more apparent by describing in detail embodiments thereof with reference to the attached drawings, in which.

DETAILED DESCRIPTION OF THE EMBODIMENTS

Figure 1:
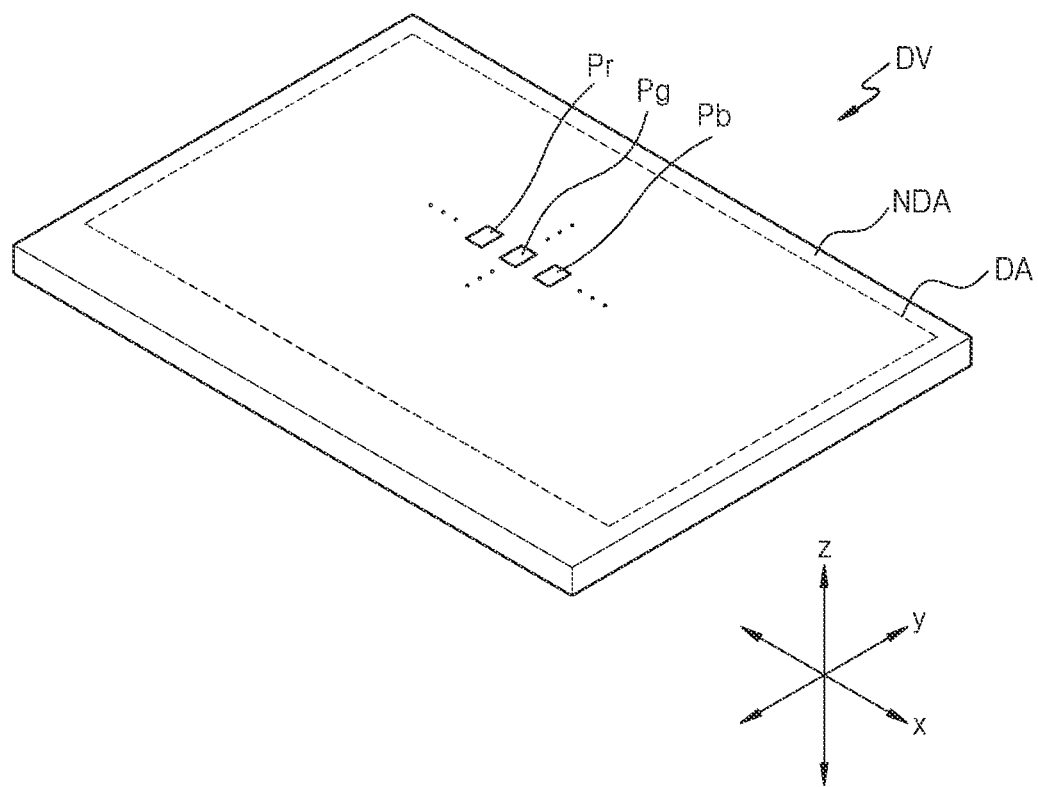
FIG. 1 is a schematic perspective view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Reference will now be made in detail to embodiments, examples of which are illustrated in the accompanying drawings, wherein like reference numerals refer to like elements throughout. The embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. The effects and features of the disclosure, and ways to achieve them will become apparent by referring to embodiments that will be described later in detail with reference to the drawings. However, the disclosure is not limited to the following embodiments but may be embodied in various forms.

Hereinafter, embodiments of the disclosure will be described in detail with reference to the accompanying drawings, and in the description with reference to the drawings, like reference numerals refer to like elements and redundant descriptions thereof will be omitted.

In the embodiments below, it will be understood when various elements such as a layer, a film, an area, or a plate is referred to as being "on" or "above" another element, it can be directly on or above the other element, or an intervening element may also be present. Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view illustrating a display apparatus according to an embodiment.

Referring to FIG. 1, a display apparatus DV may include a display area DA and a non-display area NDA outside the display area DA. The display apparatus DV may provide an image through an array of sub-pixels arranged two-dimensionally on an x-y plane. The sub-pixels may include a first sub-pixel, a second sub-pixel, and a third sub-pixel; hereinafter, for convenience of description, the first sub-pixel is described as a red sub-pixel Pr, the second sub-pixel is described as a green sub-pixel Pg, and the third sub-pixel is described as a blue sub-pixel Pb.

The red sub-pixel Pr, the green sub-pixel Pg, and the blue sub-pixel Pb may be areas from which red, green, and blue light may be emitted, respectively, and the display apparatus DV may provide an image by using light emitted from these sub-pixels.

The non-display area NDA may be an area from which no image is provided, and may entirely surround the display area DA. In the non-display area NDA, a driver or a main voltage line for providing an electrical signal or power to sub-pixel circuits may be arranged. A pad, which is an area to which an electronic element or a printed circuit board may be electrically connected, may be included in the non-display area NDA.

The display area DA may have a polygonal shape including a quadrangle, as illustrated in FIG. 1. For example, the display area DA may have a rectangular shape having a longer width than a length or a rectangular shape having a shorter width than a length, or a square shape. In other examples, the display area DA may have various shapes such as an oval or a circle.

Figure 2:
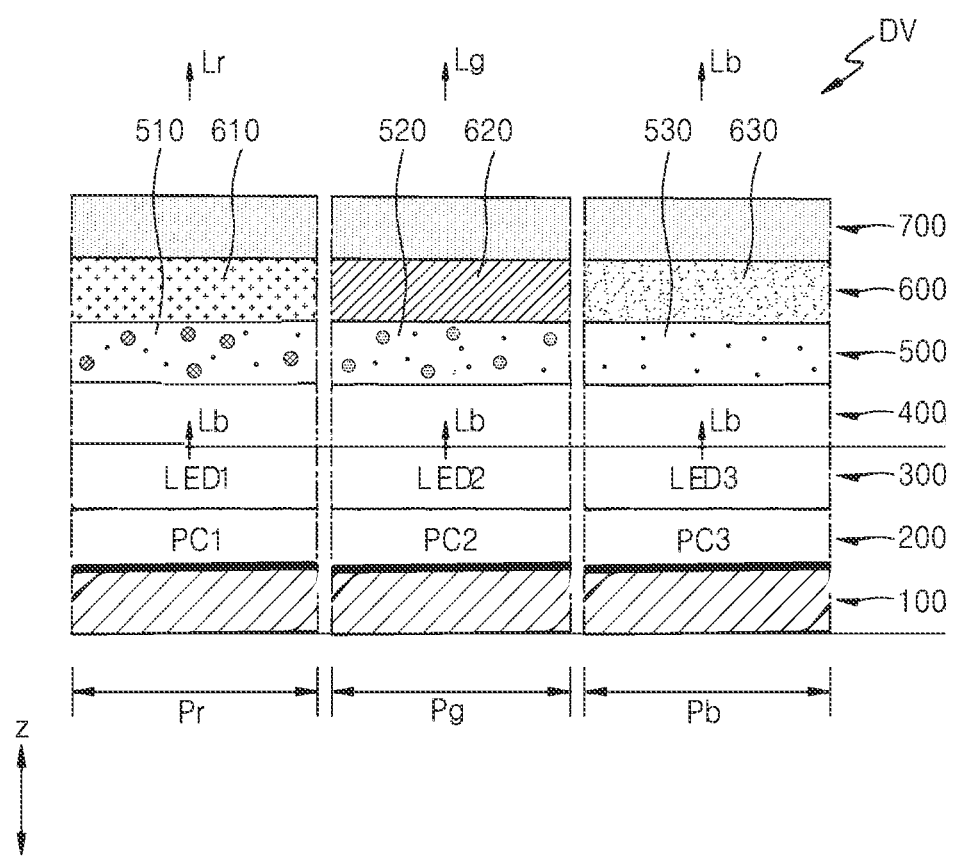
FIG. 2 is a schematic cross-sectional view illustrating sub-pixels of a display apparatus according to an embodiment.

FIG. 2 is a schematic cross-sectional view illustrating sub-pixels of a display apparatus according to an embodiment.

Referring to FIG. 2, the display apparatus DV may include a circuit layer 200 on a substrate 100 (e.g., in a z-direction). The circuit layer 200 may include first to third sub-pixel circuits PC1, PC2, and PC3, and the first to third sub-pixel circuits PC1, PC2, and PC3 may be electrically connected to first to third light-emitting diodes LED1, LED2, and LED3 of a light-emitting diode layer 300, respectively.

The first to third light-emitting diodes LED1, LED2, and LED3 may include an organic light-emitting diode including an organic material. According to an embodiment, the first to third light-emitting diodes LED1, LED2, and LED3 may include an inorganic light-emitting diode including an inorganic material. The inorganic light-emitting diode may include a PN junction diode including inorganic semiconductor-based materials. When a voltage is applied to the PN junction diode in a forward direction, holes and electrons are injected, and energy generated by recombination of the holes and electrons may be converted into light energy to emit light of a selected color. The inorganic light-emitting diode may have a width of several to several hundred micrometers or several to several hundred nanometers. In some embodiments, a light-emitting diode LED may include a light-emitting diode including quantum dots. As described above, an emission layer of the light-emitting diode LED may include an organic material, an inorganic material, quantum dots, an organic material and quantum dots, or an inorganic material and quantum dots.

The first to third light-emitting diodes LED1, LED2, and LED3 may emit light of the same color. For example, light (e.g., blue light Lb) emitted from the first to third light-emitting diodes LED1, LED2, and LED3 may pass through an encapsulation layer 400 on the light-emitting diode layer 300 and pass through the color conversion-transmission layer 500.

The color conversion-transmission layer 500 may include optical portions that convert a color of light (e.g., blue light Lb) emitted from the light-emitting diode layer 300 or that transmit the light without converting it. For example, the color conversion-transmission layer 500 may include color conversion portions that convert light (e.g., the blue light Lb) emitted from the light-emitting diode layer 300 into light of another color, and a transmission portion that transmits the light emitted from the light-emitting diode layer 300 without converting the color of the light. The color conversion-transmission layer 500 may include a first color conversion portion 510 corresponding to the red sub-pixel Pr, a second color conversion portion 520 corresponding to the green sub-pixel Pg, and a transmission portion 530 corresponding to the blue sub-pixel Pb. The first color conversion portion 510 may convert the blue light Lb into red light Lr, and the second color conversion portion 520 may convert the blue light Lb into green light Lg. The transmission portion 530 may transmit the blue light Lb without converting it.

A color layer 600 may be disposed on the color conversion-transmission layer 500. The color layer 600 may include first to third color filters 610, 620, and 630 having different colors. For example, the first color filter 610 may include a red color filter, the second color filter 620 may include a green color filter, and the third color filter 630 may include a blue color filter.

Color purity of light, on which color conversion is performed and which is transmitted by the color conversion-transmission layer 500 may be improved as the light passes through the first to third color filters 610, 620, and 630. The color layer 600 may prevent or minimize external light (e.g., light incident from the outside of the display apparatus DV toward the display apparatus DV), which is reflected and viewed by a user.

A light-transmissive base layer 700 may be included on the color layer 600. The light-transmissive base layer 700 may include glass or a light-transmissive organic material. For example, the light-transmissive base layer 700 may include a light-transmissive organic material such as an acrylic resin.

In an embodiment, when fabricating the display apparatus DV, the light-transmissive base layer 700 may be used as a substrate, and the color layer 600 and the color conversion-transmission layer 500 may be formed on the light-transmissive base layer 700. The light-transmissive base layer 700, the color layer 600, and the color conversion-transmission layer 500 may be integrated with the other layers of the display apparatus DV such that the color conversion-transmission layer 500 faces the encapsulation layer 400.

In other examples, the color conversion-transmission layer 500 and the color layer 600 may be sequentially formed on the encapsulation layer 400, and the light-transmissive base layer 700 may be directly applied on the color layer 600 and cured. In an embodiment, an optical film, such as an anti-reflection (AR) film, may be disposed on the light-transmissive base layer 700.

The display apparatus DV described above may be included in an electronic device displaying a moving picture or a still image, such as a television, a billboard, a screen for movie theaters, a monitor, a tablet personal computer (PC), or a notebook computer.

Figure 3:
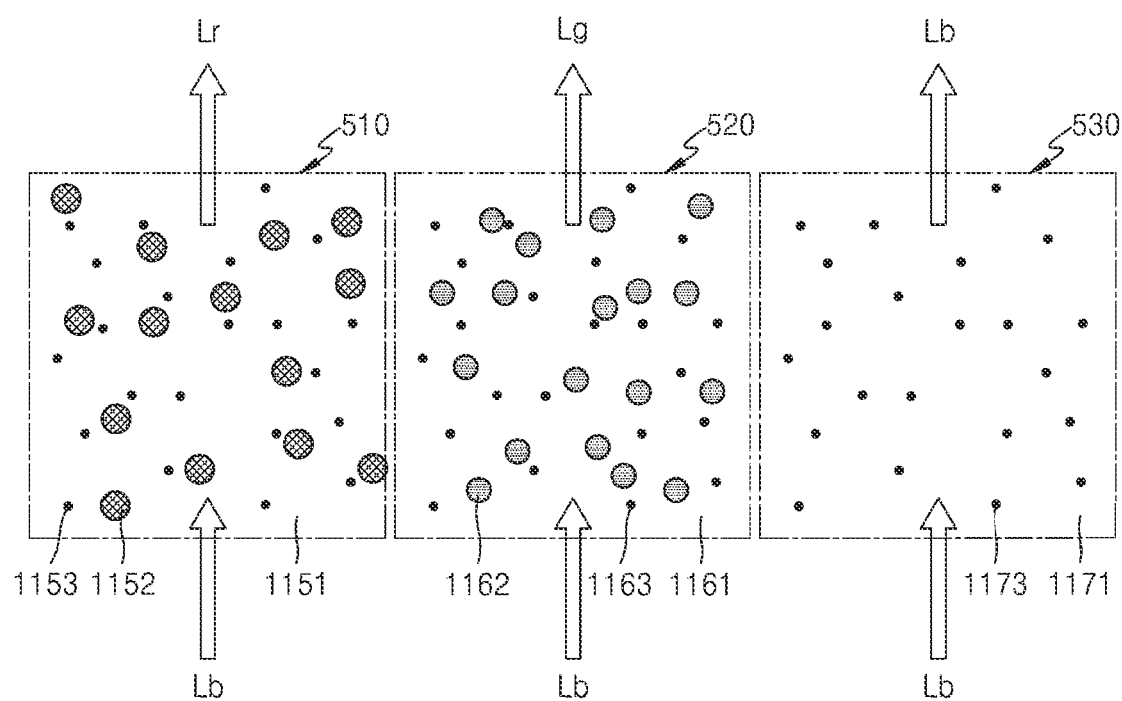
FIG. 3 illustrates respective optical portions of a color conversion-transmission layer of FIG. 2.

FIG. 3 illustrates respective optical portions of the color conversion-transmission layer 500 of FIG. 2.

Referring to FIG. 3, the first color conversion portion 510 may convert the incident blue light Lb into red light Lr. As illustrated in FIG. 3, the first color conversion portion 510 may include a first photosensitive polymer 1151 and first quantum dots 1152 and first scattering particles 1153 dispersed in the first photosensitive polymer 1151.

The first quantum dots 1152 may be excited by blue light Lb to isotropically emit red light Lr which has a longer wavelength than blue light Lb. The first photosensitive polymer 1151 may include an organic material that is light-transmissive. The first scattering particles 1153 may scatter blue light Lb that is not absorbed into the first quantum dots 1152 and thus excite more first quantum dots 1152, thereby increasing the color conversion efficiency. The first scattering particles 1153 may include, for example, titanium oxide ($TiO_2$) or metal particles. The first quantum dots 1152 may be selected from a Group II-VI compound, a Group III-V compound, a Group IV-VI compound, a Group IV element, a Group IV compound, and combinations thereof.

The second color conversion portion 520 may convert incident blue light Lb into green light Lg. As illustrated in FIG. 3, the second color conversion portion 520 may include a second photosensitive polymer 1161 and second quantum dots 1162 and second scattering particles 1163 dispersed in the second photosensitive polymer 1161.

The second quantum dots 1162 may be excited by blue light Lb to isotropically emit green light Lg having a longer wavelength than blue light Lb. The second photosensitive polymer 1161 may include an organic material that is light-transmissive.

The second scattering particles 1163 may scatter blue light Lb that is not absorbed into the second quantum dots 1162, and thus excite more second quantum dots 1162, thereby increasing the color conversion efficiency. The second scattering particles 1163 may include, for example, titanium oxide ($TiO_2$) or metal particles. The second quantum dots 1162 may be selected from a Group II-VI compound, a Group III-V compound, a Group IV-VI compound, a Group IV element, a Group IV compound, and combinations thereof.

In some embodiments, the first quantum dots 1152 and the second quantum dots 1162 may include a same material. The size of the first quantum dots 1152 may be greater than the size of the second quantum dots 1162.

The transmission portion 530 may transmit the incident blue light Lb without converting the blue light Lb. As illustrated in FIG. 3, the transmission portion 530 may include a third photosensitive polymer 1171 in which third scattering particles 1173 are dispersed. The third photosensitive polymer 1171 may include, for example, an organic material that is light-transmissive, such as a silicone resin or an epoxy resin, and may be the same material as the first and second photosensitive polymers 1151 and 1161. The third scattering particles 1173 may scatter and emit the blue light Lb, and the first, second, and third scattering particles 1153, 1163, and 1173 may include a same material.

Figure 4:
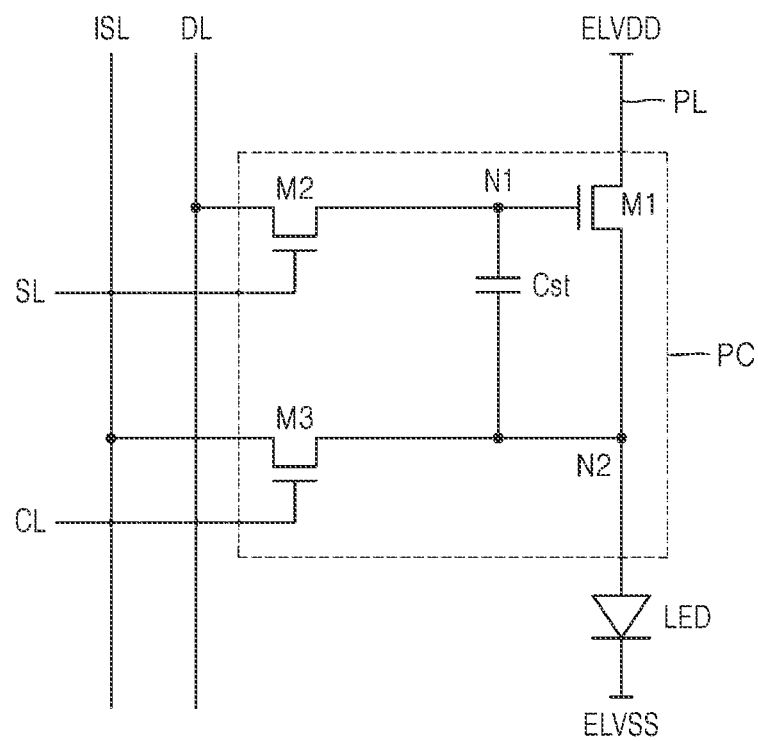
FIG. 4 is a schematic diagram of an equivalent circuit illustrating a light-emitting diode included in a display apparatus according to an embodiment and a sub-pixel circuit electrically connected to the light-emitting diode.

FIG. 4 is a schematic diagram of an equivalent circuit illustrating a light-emitting diode included in a display apparatus according to an embodiment and a sub-pixel circuit electrically connected to the light-emitting diode. A sub-pixel circuit PC illustrated in FIG. 4 may correspond to the first to third sub-pixel circuits PC1, PC2, and PC3 described above with reference to FIG. 2, and the light-emitting diode LED of FIG. 4 may correspond to the first to third light-emitting diodes LED1, LED2, and LED3 described above with reference to FIG. 2.

Referring to FIG. 4, a first electrode (e.g., an anode) of a light-emitting diode, for example, the light-emitting diode LED, may be electrically connected to the sub-pixel circuit PC, and a second electrode of the light-emitting diode LED (e.g., cathode) may be electrically connected to a main common voltage line to be described later with reference to FIG. 5, to receive a common voltage ELVSS. The light-emitting diode LED may emit light with a luminance corresponding to the amount of current supplied from the sub-pixel circuit PC.

The light-emitting diode LED of FIG. 4 may correspond to one of the first to third light-emitting diodes LED1, LED2, and LED3 illustrated in FIG. 2, and the sub-pixel circuit PC of FIG. 4 may correspond to one of the first to third sub-pixel circuits PC1, PC2, and PC3 illustrated in FIG. 2.

The sub-pixel circuit PC may control the amount of current flowing from a driving voltage ELVDD to the common voltage ELVSS via the light-emitting diode LED in response to a data signal. The sub-pixel circuit PC may include a first transistor M1, a second transistor M2, a third transistor M3, and a storage capacitor Cst.

Each of the first transistor M1, the second transistor M2, and the third transistor M3 may include an oxide semiconductor transistor including a semiconductor layer including an oxide semiconductor, or a silicon semiconductor including a semiconductor layer including polysilicon. According to the type of transistor, a first electrode may include one of a source electrode and a drain electrode, and a second electrode may include the other one of the source electrode and the drain electrode.

A first electrode of the first transistor M1 may be electrically connected to a driving voltage line PL that supplies the driving voltage ELVDD, and a second electrode thereof may be electrically connected to the first electrode of the light-emitting diode LED. A gate electrode of the first transistor M1 may be electrically connected to a first node N1. The first transistor M1 may control, in response to a voltage of the first node N1, the amount of current flowing through the light-emitting diode LED from the driving voltage ELVDD.

The second transistor M2 may include a switching transistor. A first electrode of the second transistor M2 may be electrically connected to a data line DL, and a second electrode thereof may be electrically connected to the first node N1. A gate electrode of the second transistor M2 may be electrically connected to the scan line SL. When a scan signal is supplied to a scan line SL, the second transistor M2 may be turned on to electrically connect the data line DL to the first node N1.

The third transistor M3 may include an initialization transistor and/or a sensing transistor. A first electrode of the third transistor M3 may be electrically connected to a second node N2, and a second electrode thereof may be electrically connected to a sensing line ISL. A gate electrode of the third transistor M3 may be electrically connected to a control line CL.

A storage capacitor Cst may be electrically connected between the first node N1 and the second node N2. For example, a first capacitor electrode of the storage capacitor Cst may be electrically connected to the gate electrode of the first transistor M1, and a second capacitor electrode of the storage capacitor Cst may be connected to the first electrode of the light-emitting diode LED.

While the first transistor M1, the second transistor M2, and the third transistor M3 are illustrated as NMOSs (n-type metal oxide semiconductors) in FIG. 4, the disclosure is not limited thereto. For example, at least one of the first transistor M1, the second transistor M2, and the third transistor M3 may include a PMOS (p-type metal oxide semiconductor).

While three transistors are illustrated in FIG. 4, the disclosure is not limited thereto. The sub-pixel circuit PC may include four or more transistors.

Figure 5:
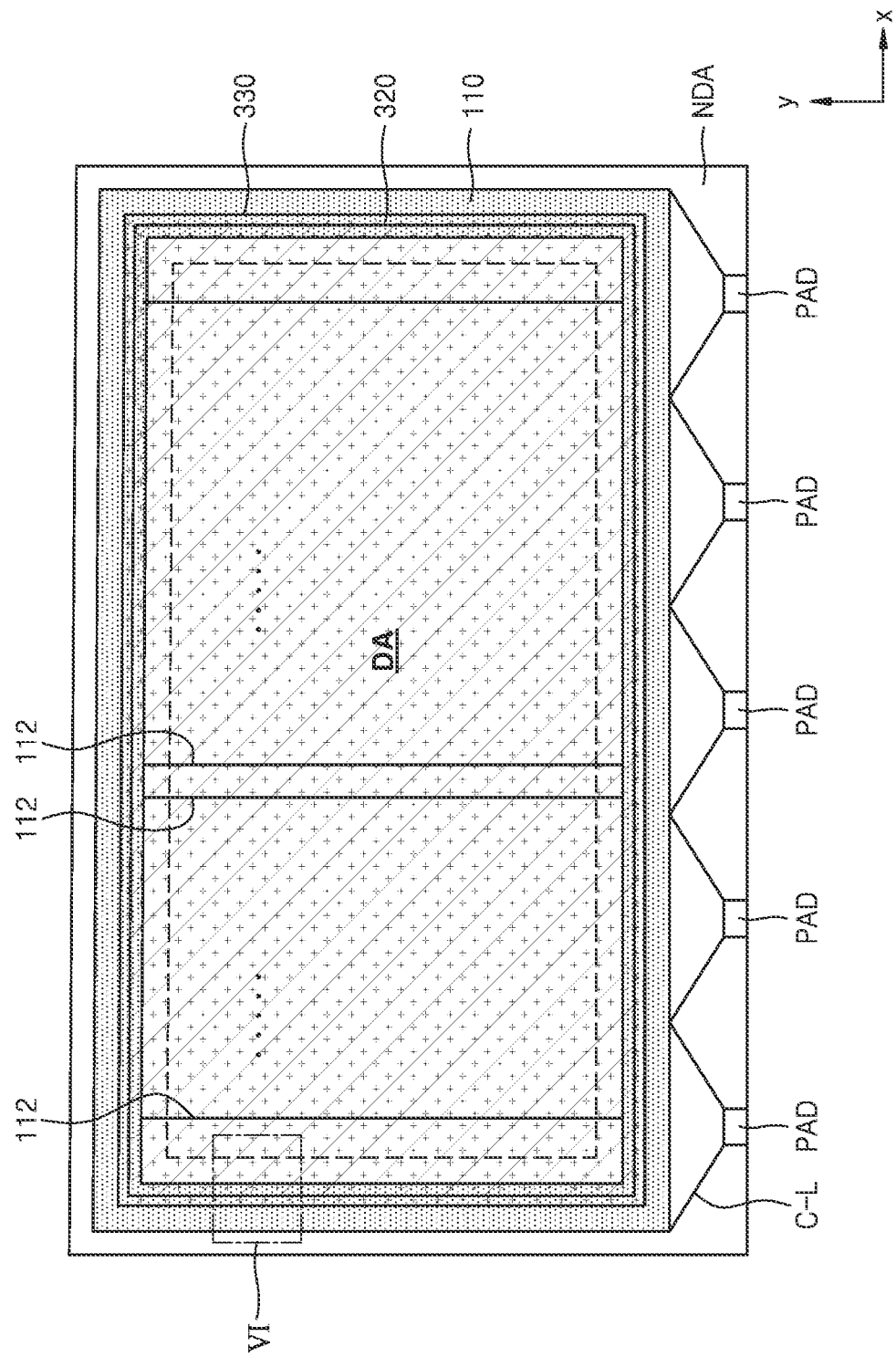
FIG. 5 is a schematic plan view illustrating a display apparatus according to an embodiment.

FIG. 5 is a schematic plan view illustrating a display apparatus according to an embodiment.

As illustrated in FIG. 5, a second electrode 330 of the light-emitting diode LED described above in FIG. 4 (the cathode of the light-emitting diode electrically connected to the line which supplies the common voltage ELVSS)) may overlap the entire display area DA. Multiple light-emitting diodes may be arranged in the display area DA, where the second electrode 330 may be shared by the light-emitting diodes as a common electrode.

An emission layer 320 of the light-emitting diode LED described above with reference to FIG. 4 may overlap the entire display area DA in a plan view, in a similar manger as the second electrode 330. The emission layer 320 emitting light of a selected color (e.g., blue) may be shared by the light-emitting diodes as a common layer.

A main common voltage line 110 may be arranged in the non-display area NDA outside the display area DA. For example, the main common voltage line 110 may entirely surround the display area DA, in the non-display area NDA. The main common voltage line 110 may be electrically connected to a pad PAD through a connection line C-L. The pad PAD may be electrically connected to an electronic device or a printed circuit board (not shown).

The second electrode 330 of the light-emitting diodes may be electrically connected to the main common voltage line 110 in the non-display area NDA. For example, the second electrode 330 of the light-emitting diodes may directly contact a portion of the main common voltage line 110 in the non-display area NDA.

Auxiliary wires 112 extending from the main common voltage line 110 may be arranged in the display area DA. The auxiliary wires 112 may be arranged parallel to each other in the display area DA. When the display area DA has a relatively large area, a voltage drop of the second electrode 330 may occur in portions of the display area DA. For example, a voltage drop may occur in a central portion of the second electrode 330 located relatively far from the main common voltage line 110, due to the resistance of the second electrode 330 itself. The voltage drop may deteriorate the display quality. However, according to an embodiment, the auxiliary wires 112 electrically connected to the main common voltage line 110 may extend across the display area DA, and as the auxiliary wires 112 may be electrically connected to the second electrode 330 in the display area DA, a voltage drop may be prevented.

Figure 6:
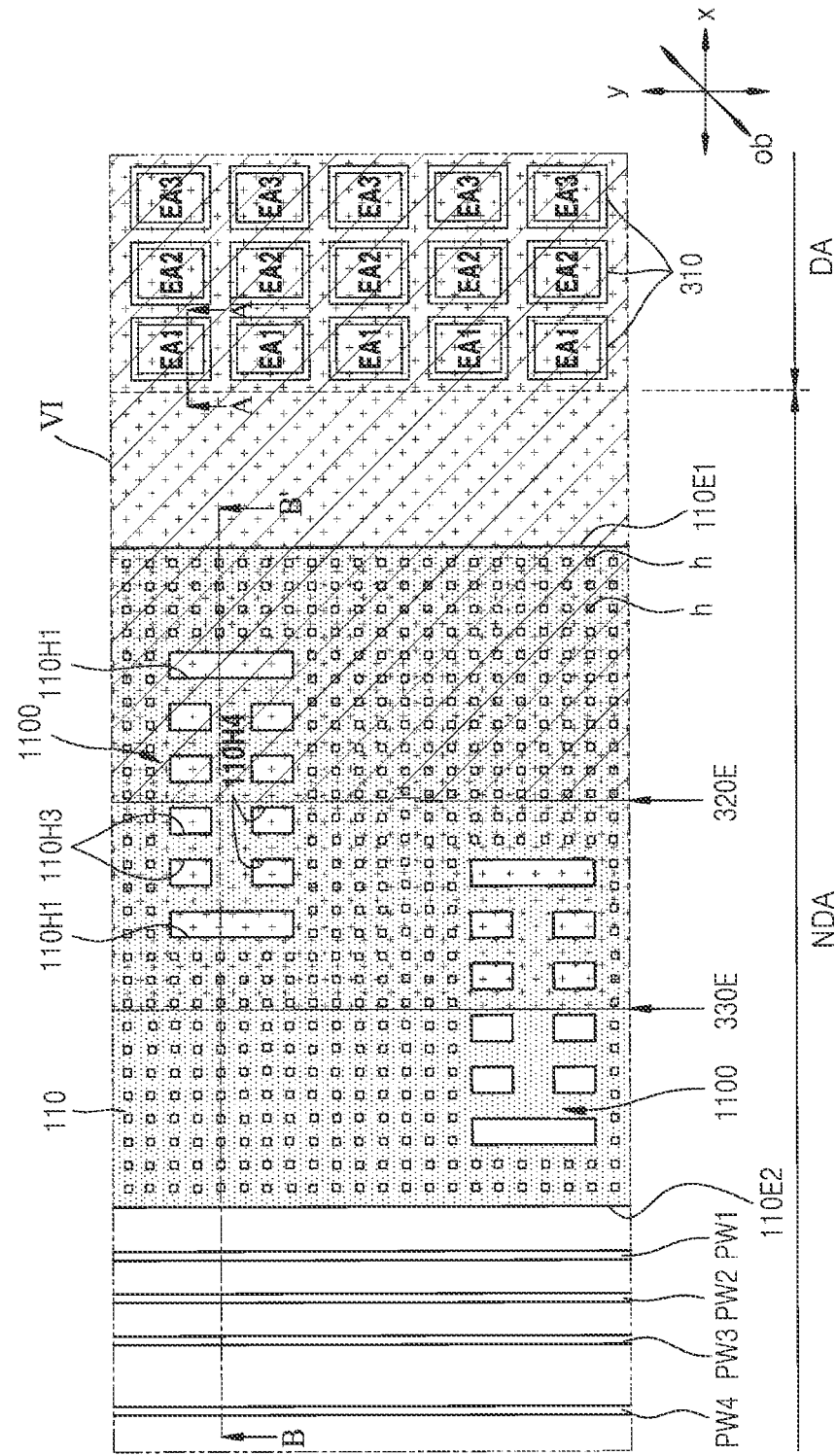
FIG. 6 is an enlarged schematic plan view of portion VI of FIG. 5.
Figure 7:
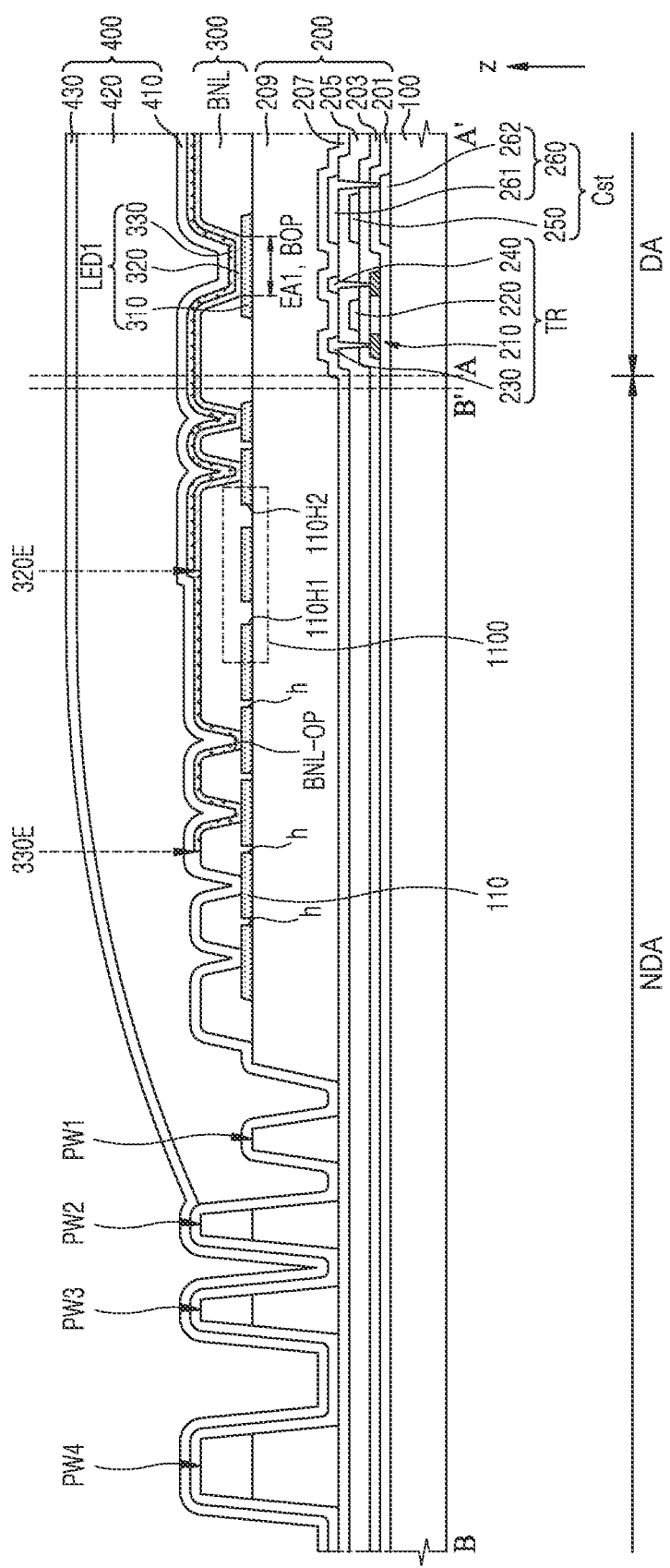
FIG. 7 is a schematic cross-sectional view of portions cut along line A-A' and line B-B'.

FIG. 6 is an enlarged schematic plan view of portion VI of FIG. 5, and FIG. 7 is a schematic cross-sectional view taken along line A-A' and line B-B' of FIG. 6. In FIG. 7, for convenience of description, the color conversion-transmission layer 500, the color layer 600, and the light-transmissive base layer 700 described above with reference to FIG. 2 are omitted. For example, FIG. 7 illustrates a stacked structure corresponding to the circuit layer 200, the light-emitting diode layer 300, and the encapsulation layer 400 on the substrate 100.

Referring to the display area DA of FIG. 6, light-emission areas, for example, first to third light-emission areas EA1, EA2, and EA3, may be arranged in the display area DA. The first to third light-emission areas EA1, EA2, and EA3 may emit light of the same color. For example, blue light emitted from each of the first to third light-emission areas EA1, EA2, and EA3 may pass through the color conversion-transmission layer 500 as described above with reference to FIG. 2 and be converted into red light or green light or may pass through without color conversion to be viewed by a user.

Light-emitting diodes emitting blue light may be arranged in the first to third light-emission areas EA1, EA2, and EA3. FIG. 7 illustrates a first light-emitting diode LED1 that may be arranged in the first light-emission area EA1. While FIG. 7 illustrates the first light-emitting diode LED1 in the first light-emission area EA1, the second and third light-emitting diodes LED2 and LED3 (refer to FIG. 2) arranged in the second light-emission area EA2 and the third light-emission area EA3 may also have the same structure as the first light-emitting diode LED1 of the first light-emission area EA1.

Referring to the cross-section taken along line A-A' in FIG. 7, the circuit layer 200 may be disposed on the substrate 100, and the light-emitting diode layer 300 including the light-emitting diode LED may be disposed on the circuit layer 200, and the light-emitting diode layer 300 may be sealed by the encapsulation layer 400.

The substrate 100 may include a glass material or a polymer resin, and the substrate 100 including a polymer resin may be flexible. For example, the shape of a display apparatus including the substrate 100, which may be a flexible substrate, may be modified to be a curved, bendable, rollable, or foldable shape.

A buffer layer 201 may be disposed on the substrate 100 and prevent penetration of impurities from the substrate 100 into the transistor TR. The buffer layer 201 may include an inorganic insulating material such as silicon oxide, silicon nitride, and/or silicon oxynitride.

A semiconductor layer 210 of the transistor TR is disposed on the buffer layer 201. The semiconductor layer 210 may include an oxide semiconductor. The oxide semiconductor may include indium gallium zinc oxide (IGZO), zinc tin oxide (ZTO), indium zinc oxide (IZO), or the like. In other examples, the semiconductor layer 210 may include polysilicon, amorphous silicon, or an organic semiconductor. The semiconductor layer 210 may include a channel region overlapping a gate electrode 220 in a plan view, and conductive regions may be disposed on both sides of the channel region and are doped with impurities or made conductive. One of the conductive regions may correspond to a source region and the other conductive region may correspond to a drain region.

The gate electrode 220 may overlap the channel region of the semiconductor layer 210 in a plan view, with a gate insulating layer 203 disposed therebetween. The gate electrode 220 may include a conductive material including molybdenum (Mo), aluminum (Al), copper (Cu), titanium (Ti), and the like, and may have a multi-layer or single-layer structure including such materials. The gate insulating layer 203 may include an inorganic insulating material such as silicon oxide, silicon nitride, and/or silicon oxynitride.

A source electrode 230 and a drain electrode 240 may be disposed on an interlayer insulating layer 205, and may be electrically connected to the conductive regions of the semiconductor layer 210. The interlayer insulating layer 205 may include an inorganic insulating material such as silicon oxide, silicon nitride, and/or silicon oxynitride.

The storage capacitor Cst may include at least two capacitor electrodes. In an embodiment, FIG. 7 illustrates the storage capacitor Cst including a first capacitor electrode 250 and a second capacitor electrode 260, wherein the second capacitor electrode 260 includes first and second sub-capacitor electrodes 261 and 262 disposed on different layers from each other. The first and second sub-capacitor electrodes 261 and 262 may each overlap the first capacitor electrode 250. While FIG. 7 illustrates that the second capacitor electrode 260 includes the first and second sub-capacitor electrodes 261 and 262, in other examples, one of the first and second sub-capacitor electrodes 261 and 262 may be omitted.

An inorganic protective layer 207 may be formed on the transistor TR and the storage capacitor Cst. The inorganic protective layer 207 may include an inorganic insulating material such as silicon oxide, silicon nitride, and/or silicon oxynitride.

An organic insulating layer 209 may include an organic insulating material such as acrylic, benzocyclobutene (BCB), polyimide, or hexamethyldisiloxane (HMDSO).

The first light-emitting diode LED1 may include a first electrode 310, the emission layer 320, and the second electrode 330.

The first electrode 310 may include a transparent conductive material such as indium tin oxide (ITO), IZO, zinc oxide (ZnO), indium oxide (In$_2$O$_3$), indium gallium oxide (IGO) or aluminum zinc oxide (AZO). In other examples, the first electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In other examples, the first electrode 310 may have a structure in which layers including ITO, IZO, ZnO or In$_2$O$_3$ are above or below the reflective layer. For example, the first electrode 310 may have a three-layer structure in which an ITO layer, a silver (Ag) layer, and an ITO layer are stacked.

A bank layer BNL may be disposed on the first electrode 310 and may cover edges of the first electrode 310. The bank layer BNL may include an opening BOP (hereinafter referred to as a "light-emission opening") overlapping a portion of the first electrode 310, and the light-emission opening BOP may expose a portion of the first electrode 310.

The light-emission opening BOP may define the first light emission area EA1 of the first light-emitting diode LED1. For example, a width of the light-emission opening BOP may correspond to a width of the first light-emission area EA1. The bank layer BNL may include an organic material.

The emission layer 320 may overlap the first electrode 310 through the light-emission opening BOP. Although not illustrated, functional layer(s) may be disposed below and/or above the emission layer 320. The functional layer(s) may include a hole injection layer (HIL), a hole transport layer (HTL), an electron transport layer (ETL), and/or an electron injection layer (EIL). As described with reference to FIG. 5, the emission layer 320 may be formed to entirely cover the display area DA, and like the emission layer 320, the functional layer(s) may also be arranged between the first electrode 310 and the second electrode 330 such that the functional layer(s) completely covers the display area DA.

The second electrode 330 may include a conductive material having a low work function. For example, the second electrode 330 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In other examples, the second electrode 330 may further include a layer such as ITO, IZO, ZnO or In$_2$O$_3$ on the (semi)transparent layer.

The encapsulation layer 400 may be disposed on the second electrode 330. The encapsulation layer 400 may include at least one inorganic encapsulation layer and at least one organic encapsulation layer. FIG. 7 illustrates the encapsulation layer 400 including a first inorganic encapsulation layer 410, an organic encapsulation layer 420, and a second inorganic encapsulation layer 430.

The first inorganic encapsulation layer 410 may include an inorganic insulating material such as silicon oxide, silicon nitride, and/or silicon oxynitride. According to necessity, a capping layer including an organic insulating material and/or an inorganic insulating material, and a LiF layer may be between the first inorganic encapsulation layer 410 and the second electrode 330.

As the first inorganic encapsulation layer 410 is formed along a structure therebelow, an upper surface thereof is not flat. The organic encapsulation layer 420 covers the first inorganic encapsulation layer 410, and unlike the first inorganic encapsulation layer 410, an upper surface of the organic encapsulation layer 420 located in the display area DA may be approximately flat. In detail, a portion of the organic encapsulation layer 420 corresponding to the display area DA may have a substantially flat upper surface, and the organic encapsulation layer 420 may have a gentle slope in the non-display area NDA.

The organic encapsulation layer 420 may be formed by applying a monomer and then curing the monomer. Partition walls may be arranged in the non-display area NDA to control the flow of the monomer. FIG. 7 illustrates first to fourth partition walls PW1, PW2, PW3, and PW4.

The first to fourth partition walls PW1, PW2, PW3, and PW4 may be arranged outside the display area DA. The main common voltage line 110 may be disposed between the display area DA and the first to fourth partition walls PW1, PW2, PW3, and PW4. The first to fourth partition walls PW1, PW2, PW3, and PW4 may include an organic insulating material. One of the first to fourth partition walls PW1, PW2, PW3, and PW4, for example, the fourth partition wall PW4 arranged in an outermost portion, may support a mask used in a process of forming the emission layer 320 and/or the second electrode 330.

The organic encapsulation layer 420 may include one or more materials selected from polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include an inorganic insulating material such as silicon oxide, silicon nitride, and/or silicon oxynitride. The second inorganic encapsulation layer 430 may directly contact the first inorganic encapsulation layer 410 on some partition walls, for example, the third partition wall PW3 and the fourth partition wall PW4.

As illustrated in FIG. 6, the first electrodes 310 are spaced apart from each other and respectively arranged in the first to third light emission areas EA1, EA2, and EA3, whereas the emission layer 320 and the second electrode 330 may be deposited using a mask that may have an opening larger in area than the area of the display area DA. Accordingly, each of the emission layer 320 and the second electrode 330 may overlap the entire area of the display area DA, as described above with reference to FIG. 5.

Each of the emission layer 320 and the second electrode 330 may have an area larger than that of the display area DA, and outer portions of the emission layer 320 and the second electrode 330, which do not overlap the display area DA, may be located in the non-display area NDA. FIGS. 6 and 7 illustrate that an edge 320E of the emission layer 320 and an edge 330E of the second electrode 330 are disposed in the non-display area NDA.

The emission layer 320 may have a smaller area than the second electrode 330. Accordingly, as illustrated in FIGS. 6 and 7, the edge 320E of the emission layer 320 may be disposed closer to the display area DA than the edge 330E of the second electrode 330. The edge 320E of the emission layer 320 may be disposed between the edge 330E of the second electrode 330 and the display area DA.

Referring to the cross-sections of FIGS. 6 and 7 taken along line B-B', the second electrode 330 may extend to the non-display area NDA and overlap a portion of the main common voltage line 110. The main common voltage line 110 may be arranged on the same layer as the first electrode 310 of the light-emitting diode LED, for example, on the organic insulating layer 209. The main common voltage line 110 may include the same material as the first electrode 310 of the light-emitting diode LED.

The main common voltage line 110 may include exhaust holes h that are two-dimensionally arranged along an x-direction and a y-direction, as shown in FIG. 6. The exhaust holes h may provide a path for discharging gas included in the organic insulating layer 209 disposed below the main common voltage line 110. When heat is applied to the organic insulating layer 209 during a manufacturing process of the display apparatus, the material included in the organic insulating layer 209 may be vaporized and discharged to the outside through the exhaust holes h. Accordingly, degradation in quality of light that is emitted from a light-emitting diode caused by gas generated from the organic insulating layer 209 and moves toward the display area DA due to lack of the exhaust holes h may be prevented.

The outer portion of the second electrode 330 disposed in the non-display area NDA may directly contact a portion of the main common voltage line 110 while overlapping the main common voltage line 110. For example, the outer portion of the second electrode 330 may directly contact a portion of the main common voltage line 110 corresponding to a portion between the neighboring exhaust holes h, as illustrated in FIG. 7. The exhaust holes h may be covered by a material corresponding to the bank layer BNL. The bank layer BNL includes an opening BNL-OP disposed between the adjacent exhaust holes h, and the outer portion of the second electrode 330 may directly contact the main common voltage line 110 through the opening BNL-OP of the bank layer BNL.

The main common voltage line 110 may include at least one pattern 1100. FIG. 6 illustrates that the main common voltage line 110 includes patterns 1100 spaced apart from each other. For example, a pattern 1100 may be arranged adjacent to an inner edge of the main common voltage line 110 (an edge 110E1 which is close to the display area DA), and another pattern 1100 may be arranged adjacent to an outer edge of the main common voltage line 110 (an edge 110E2 that is relatively far from the display area DA and is disposed near the first partition wall PW1). For example, adjacent patterns 1100 may be arranged to be spaced apart from each other, without overlapping each other in a diagonal direction ob that is oblique to the x-direction and the y-direction.

The patterns 1100 may include a position tracking pattern or monitoring pattern for monitoring a position of the edge 320E of the emission layer 320 and/or the edge 330E of the second electrode 330, which are located in the non-display area NDA. One of the patterns 1100 may be used to monitor or track the position of the edge 320E of the emission layer 320, and the other patterns 1100 may be used to monitor or track the position of the edge 330E of the second electrode 330. The patterns 1100 may be covered with the bank layer BNL as illustrated in FIG. 7.

The patterns 1100 may include bars spaced apart by a selected interval. Hereinafter, the patterns 1100 are described with reference to FIGS. 8A to 8C.

Figure 8A:
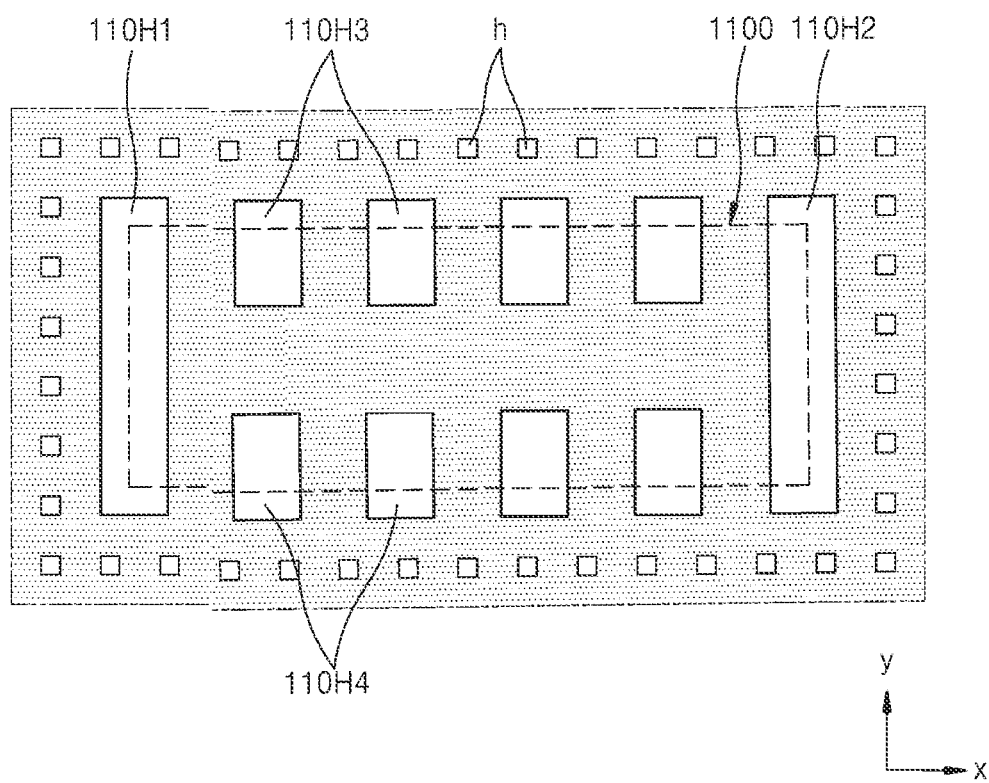
FIG. 8A is an schematic excerpt plan view of a pattern of FIG. 6 and the surroundings thereof.
Figure 8B:
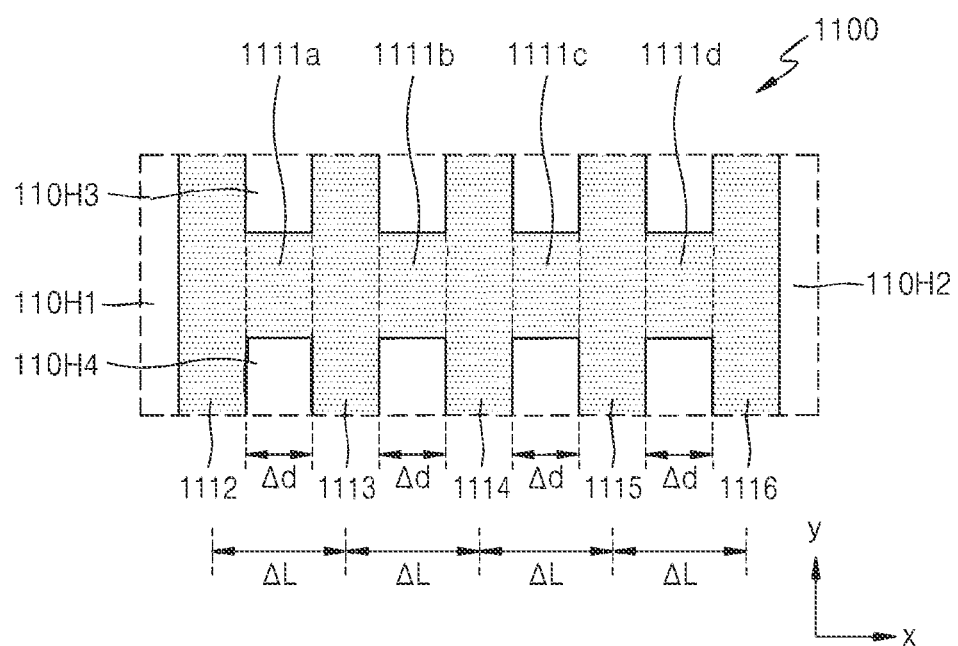
FIG. 8B is an schematic excerpt plan view of the pattern of FIG. 8A.
Figure 8C:
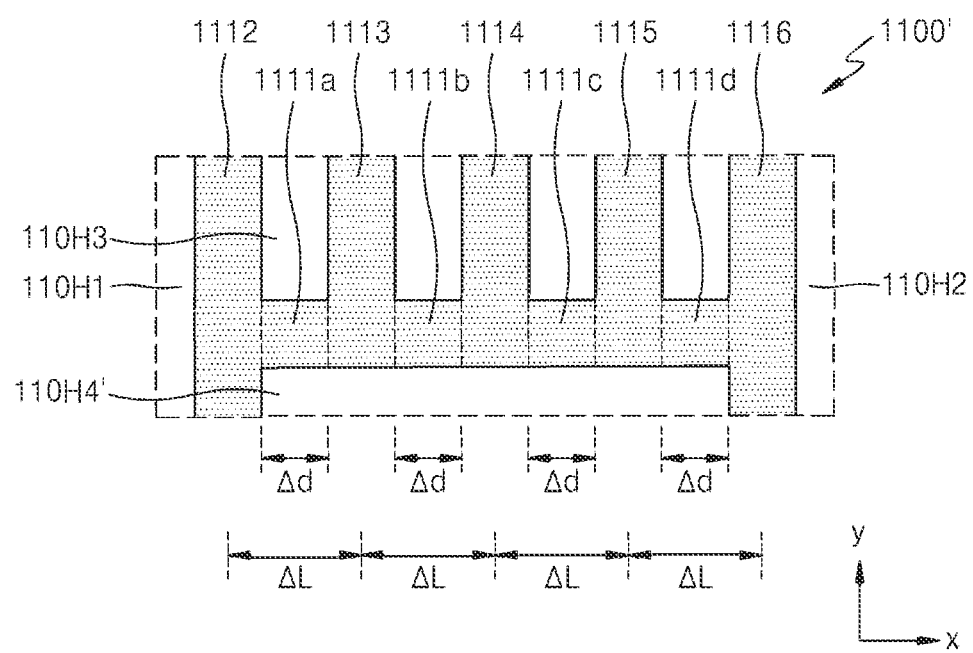
FIG. 8C is a schematic plan view illustrating a pattern according to an embodiment.

FIG. 8A is an schematic excerpt plan view of the pattern 1100 of FIG. 6 and its surroundings, and FIG. 8B is a schematic excerpt plan view illustrating the pattern 1100 of FIG. 8A, and FIG. 8C is a schematic plan view illustrating a pattern 1100' according to another embodiment.

Referring to FIG. 8A, the pattern 1100 may be defined by first to fourth holes 110H1, 110H2, 110H3, and 110H4 arranged in the main common voltage line 110. A size (or width) of the first to fourth holes 110H1, 110H2, 110H3, and 110H4 defining the pattern 1100 may each be larger than a size (or width) of the exhaust holes h arranged around the pattern 1100.

The first hole 110H1 and the second hole 110H2 may be spaced apart from each other in a first direction (e.g., the x-direction), and may each have a length in a second direction (e.g., the y-direction). The third holes 110H3 and the fourth holes 110H4 may be arranged between the first hole 110H1 and the second hole 110H2. The third holes 110H3 may be spaced apart from each other in the same direction between the first hole 110H1 and the second hole 110H2 (e.g., the first direction or a direction from the first hole 110H1 to the second hole 110H2, x-direction). Similarly, the fourth holes 110H4 may be spaced apart from each other in the same direction between the first hole 110H1 and the second hole 110H2 (e.g., in the first direction or the direction from the first hole 110H1 to the second hole 110H2, x-direction). One of the third holes 110H3 and one of the fourth holes 110H4 may be arranged along the second direction (e.g., the y-direction). Each of the third holes 110H3 and the fourth holes 110H4 may have a length along the second direction (e.g., the y-direction), and a length of each of the third holes 110H3 and the fourth hole 110H4 may be less than the length of the first hole 110H1 or the second hole 110H2.

The pattern 1100 may include bars 1112, 1113, 1114, 1115, and 1116 arranged in a direction from the inner edge 110E1 to the outer edge 110E2 of the main common voltage line 110 described in FIG. 6 and as illustrated in FIG. 8B (or in a direction away from the display area DA in an x-direction). The bars 1112, 1113, 1114, 1115, and 1116 may be arranged between the first hole 110H1 and the second hole 110H2. FIG. 8B illustrates five bars 1112, 1113, 1114, 1115, and 1116 for convenience of description, but the number of bars may be less than or equal to four or more than six.

At least a portion of each of the bars 1112, 1113, 1114, 1115, and 1116 may be spaced apart (or separated) from at least a portion of a neighboring (or adjacent) bar. A hole may be disposed between adjacent bars among the bars 1112, 1113, 1114, 1115, and 1116. In an embodiment, FIG. 8B illustrates that the third holes 110H3 and/or the fourth holes 110H4 are disposed between adjacent bars 1112, 1113, 1114, 1115, and 1116. Portions of each of the bars 1112, 1113, 1114, 1115, and 1116 may be spaced apart from portions of another adjacent bar, with the third holes 110H3 and/or the fourth holes 110H4 included therebetween.

An interval (or a separation distance Δd) between two adjacent bars may have a constant value. The separation distance Δd may correspond to a width of the third holes 110H3 and/or the fourth holes 110H4 in the first direction. Each of the bars 1112, 1113, 1114, 1115, and 1116 may have the same width in the first direction. When the separation distance Δd has a constant value and each of the bars 1112, 1113, 1114, 1115, and 1116 has the same width, a distance between the center of a bar and the center of an adjacent bar (hereinafter referred to as a central distance ΔL) may be constant.

In some embodiments, the bars 1112, 1113, 1114, 1115, and 1116 having the constant central distance ΔL may be used as a ruler, and the pattern 1100 may be used to determine a position or alignment of the emission layer 320 and/or the second electrode 330. For example, as described above with reference to FIG. 6, by checking which of the bars among the bars 1112, 1113, 1114, 1115, and 1116 are overlapped by the edge 320E of the emission layer 320 and/or the edge 330E of the second electrode 330, the position or alignment of the emission layer 320 and/or the second electrode 330 may be identified.

In some embodiments, a portion of each of the bars 1112, 1113, 1114, 1115, and 1116 may be connected to a portion of a neighboring bar. A portion of each of the bars 1112 to 1116 may be integral with each other. Referring to FIG. 8B, a portion (e.g., a central portion) of a bar (hereinafter, referred to as "first bar") 1112 disposed on a leftmost side may be connected to a portion (e.g., a central portion) of an adjacent bar (hereinafter, referred to as "second bar") 1113 via a first connection portion 1111a. A portion of the second bar 1113 (e.g., a central portion) may be connected to a portion (e.g., a central portion) of another adjacent bar (hereinafter, referred to as "third bar") 1114 via a second connection portion 1111b. A portion of the third bar 1114 (e.g., a central portion) may be connected to a portion (e.g., a central portion) of another bar (hereinafter, referred to as "fourth bar") 1115 via the third connection portion 1111c. A portion (e.g., a central portion) of the fourth bar 1115 may be connected to a portion of another bar (hereinafter referred to as "fifth bar") 1116 (e.g., a central portion) via the fourth connection portion 1111d.

The first to fourth holes 110H1, 110H2, 110H3, and 110H4 described with reference to FIGS. 8A and 8B may be entirely covered (or overlapped) by the bank layer BNL in a plan view, as described in FIG. 7. The pattern 1100 may be entirely covered by the bank layer BNL (refer to FIG. 7). For example, the bars 1112, 1113, 1114, 1115, and 1116 and the first to fourth connection portions 1111a, 1111b, 1111c and 1111d of the pattern 1100 may be entirely covered by the bank layer BNL (refer to FIG. 7).

FIG. 8B illustrates that the central portions of each of the bars 1112, 1113, 1114, 1115, and 1116 are connected to each other, but the disclosure is not limited thereto. In other examples, an end of each of the bars 1112, 1113, 1114, 1115, and 1116 may be connected to each other.

Referring to FIG. 8C, an end of each of the bars 1112, 1113, 1114, 1115, and 1116 may be connected to each other by the first to fourth connection portions 1111a, 1111b, 1111c and 1111d, and the pattern 1100 may have a comb-like shape.

The third holes 110H3 may be disposed between adjacent bars among the bars 1112, 1113, 1114, 1115, and 1116. Unlike the third holes 110H3 that are spaced apart from each other between the first and second holes 110H1 and 110H2 in the first direction (e.g., the x-direction), a fourth hole 110H4' may be elongated between the first hole 110H1 and the second hole 110H2 in the first direction (e.g., the x direction).

Even in a pattern 1100' illustrated in FIG. 8C, an interval (or a separation distance Δd) between two adjacent bars may have a constant value, and a central distance ΔL between the centers of any two adjacent bars may also have a constant value.

The patterns 1100 and 1100' described with reference to FIGS. 6 to 8C are not located only in portion VI illustrated in FIG. 5. As illustrated in FIG. 5, they may be arranged along the longitudinal direction of the main common voltage line 110 having a substantially rectangular frame shape. For example, at least one of the patterns 1100 and 1100' may also be arranged in an upper portion, a lower portion, a left portion, and a right portion of the main common voltage line 110 having a shape of a quadrangular frame.

According to the embodiment as described above, positions of intermediate layers and/or a second electrode constituting the display apparatus may be accurately controlled without adding additional processes. However, the scope of the disclosure is not limited to these effects.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display apparatus comprising:
    a light-emitting diode disposed on a substrate, the light-emitting diode including:
    a first electrode arranged in a display area;
    a second electrode disposed on the first electrode; and
    an emission layer disposed between the first electrode and the second electrode; and
    a main common voltage line arranged in a non-display area outside the display area, the main common voltage line electrically connected to the second electrode, the main common voltage line including:

an inner edge adjacent to the display area;
an outer edge opposite to the inner edge; and
a pattern including bars arranged in a direction from the inner edge to the outer edge.

2. The display apparatus of claim 1, wherein
the emission layer overlaps an entire area of the display area in a plan view, and
an edge of the emission layer overlaps the pattern in the non-display area in a plan view.

3. The display apparatus of claim 2, wherein
the main common voltage line includes an additional pattern that is spaced apart from the pattern,
the second electrode overlaps the entire area of the display area in a plan view, and
an edge of the second electrode overlaps the additional pattern in the non-display area in a plan view.

4. The display apparatus of claim 3, wherein the edge of the emission layer is disposed between the edge of the second electrode and the display area.

5. The display apparatus of claim 3, wherein
the additional pattern includes bars arranged in a direction from the inner edge to the outer edge.

6. The display apparatus of claim 1, wherein the main common voltage line includes a hole between neighboring ones among the bars of the pattern.

7. The display apparatus of claim 6, wherein an interval between the neighboring ones among the bars of the pattern is constant.

8. The display apparatus of claim 1, wherein the main common voltage line and the first electrode include a same material.

9. The display apparatus of claim 8, wherein the main common voltage line includes exhaust holes arranged around the pattern, the exhaust holes overlapping in a plan view an organic insulating layer disposed below the main common voltage line.

10. The display apparatus of claim 1, further comprising:
a bank layer overlapping an edge of the first electrode in a plan view, the bank layer including a light-emission opening overlapping the first electrode in a plan view,
wherein the bank layer extends over the main common voltage line and overlaps the pattern in a plan view.

11. An electronic device comprising:
a display apparatus, comprising:
light-emission areas disposed on a substrate and arranged in a display area;
an encapsulation layer disposed on the light-emission areas;
a color conversion-transmission layer disposed on the encapsulation layer, the color conversion-transmission layer including:
a color conversion portion that converts a color of light emitted from a light-emission area among the light-emission areas; and
a transmission portion that transmits light emitted from another light-emission area among the light-emission areas; and
at least one pattern arranged in a non-display area outside the display area, the at least one pattern including bars arranged in a first direction.

12. The electronic device of claim 11, further comprising:
first electrodes spaced apart from each other in the display area, the first electrodes respectively corresponding to the light-emission areas;
an emission layer disposed on the first electrodes; and
a second electrode disposed on the emission layer, wherein
at least one of the emission layer and the second electrode overlap an entire area of the display area in a plan view, and
at least one of an edge of the emission layer and an edge of the second electrode overlaps the at least one pattern in the non-display area in a plan view.

13. The electronic device of claim 12, wherein
each of the emission layer and the second electrode overlaps the entire area of the display area in a plan view,
the edge of the emission layer and the edge of the second electrode are disposed in the non-display area, and
the edge of the emission layer is disposed between the edge of the second electrode and the display area.

14. The electronic device of claim 13, wherein
the at least one pattern includes:
a first pattern; and
a second pattern,
the first pattern and the second pattern are spaced apart from each other,
the edge of the emission layer overlaps the first pattern in a plan view, and
the edge of the second electrode overlaps the second pattern in a plan view.

15. The electronic device of claim 12, further comprising:
a bank layer overlapping an edge of each of the first electrodes and overlapping the at least one pattern in a plan view, the bank layer including light-emission openings respectively overlapping the first electrodes in a plan view.

16. The electronic device of claim 12, further comprising:
a main common voltage line arranged in the non-display area, the main common voltage line electrically connected to the second electrode,
wherein the at least one pattern corresponds to a portion of the main common voltage line.

17. The electronic device of claim 16, wherein the main common voltage line and the first electrodes include a same material.

18. The electronic device of claim 16, wherein the main common voltage line includes a hole between neighboring ones among the bars of the at least one pattern.

19. The electronic device of claim 18, wherein an interval between the neighboring ones among the bars of the at least one pattern is constant.

20. The electronic device of claim 16, wherein the main common voltage line includes exhaust holes arranged around the at least one pattern, the exhaust holes overlapping, in a plan view, an organic insulating layer disposed below the main common voltage line.

* * * * *